United States Patent
Jin

(10) Patent No.: US 8,681,024 B2
(45) Date of Patent: Mar. 25, 2014

(54) ENCODER WITHOUT STOPPING STRUCTURE

(76) Inventor: Zhiliang Jin, Guangdong (CN)

( * ) Notice: Subject to any disclaimer, the term of this patent is extended or adjusted under 35 U.S.C. 154(b) by 0 days.

(21) Appl. No.: 13/806,884

(22) PCT Filed: Jul. 23, 2010

(86) PCT No.: PCT/CN2010/075416
§ 371 (c)(1),
(2), (4) Date: Dec. 26, 2012

(87) PCT Pub. No.: WO2011/150587
PCT Pub. Date: Dec. 8, 2011

(65) Prior Publication Data
US 2013/0106624 A1 May 2, 2013

(30) Foreign Application Priority Data

May 31, 2010 (CN) ...................... 2010 2 0209550 U

(51) Int. Cl.
*H03M 1/22* (2006.01)

(52) U.S. Cl.
USPC .............................................. 341/16; 341/11

(58) Field of Classification Search
USPC ....................................................... 341/11, 16
See application file for complete search history.

(56) References Cited

U.S. PATENT DOCUMENTS

| 4,559,525 A | * | 12/1985 | Abt et al. | 341/16 |
| 4,652,947 A | | 3/1987 | Oka et al. | |
| 7,791,504 B2 | * | 9/2010 | Sugahara et al. | 341/16 |
| 8,312,782 B2 | * | 11/2012 | McMickell et al. | 74/5.37 |

FOREIGN PATENT DOCUMENTS

| CN | 201196569 Y | 2/2009 |
| CN | 201425484 Y | 3/2010 |
| JP | 3048717 A | 3/1991 |

* cited by examiner

*Primary Examiner* — Khai M Nguyen

(57) ABSTRACT

An encoder without a stopping structure comprises a rotating shaft (1), an axis sleeve (2), a stopping base (4), a positioning elastic trip (5), a spacer (6), a partition plate (7), at least one movable arm (8), at least one electric brush (9) and at least one main body (11), and they are sequentially arranged from bottom to top. There is not any stopping structure on the rotating shaft (1) and the stopping base (4). The rotating shaft (1) can be rotated 360 degrees or more. The electric brush (9) has a plastic covered part (91), a bent part (92), an elastic arm (93) and a brush head (94) forming an integrated structure. The plastic covered part (91) is covered in a movable arm (8). The bent part (92) connects the plastic covered part (91) and the elastic arm (93) and bends the elastic arm (93) toward the plastic covered part (91). The elastic arm (93) comprises a main arm (931) with long strip ring body and a branch arm (932). Said brush head (94) is pressed at the free ends of the main arm (931) and the branch arm (932). The number of channels of the encoder increases to 32 or more, so that the programming and operating control can be conveniently realized. The electric brush is connected steadily with the circuit plate of the encoding circuit because of the electric brush without any loose situations.

5 Claims, 4 Drawing Sheets

ENCODER WITHOUT STOPPING STRUCTURE

FIELD OF THE INVENTION

The present invention relates to electronic components, and more particularly to an encoder without a stopping structure.

BACKGROUND OF THE INVENTION

A conventional encoder has a rotating shaft inserted through an axial hole of an axis sleeve so that the rotating shaft rotates in the axial hole of the axis sleeve. The conventional encoder also has a stopping base on which an axial hole is defined to match with the axial hole of the rotating shaft, such that the stopping base rotates with the stopping base. Likewise, a stopping structure is fixed on the rotating shaft and the stopping base so as to limit a rotating angle of the rotating shaft, for example, the rotating shaft only rotates within 320 degrees. The stopping structure includes the rotating shaft and two stop blocks of the stopping base, so when the two stop blocks hit each other, the rotating shaft does not rotate forward but rotates backward. If the rotating angle (i.e., 320 degrees) of the rotating shaft is divided into 16 units, then each rotating unit is 20 degrees and corresponds to a channel, so there are 16 channels defined in the encoder. However, such a conventional stopping structure is encoded inconveniently. For example, a number of the channels is limited without being increased, thus limiting an encoding program.

Furthermore, the electrical brush is riveted with the movable arm, so the following defects occur. For instance, the electrical brush is riveted with the circuit plate insecurely, thus affecting the stability of the signal. Due to the electrical brush is riveted with the circuit plate at a high temperature, thermal expansion and contraction will loosen the electrical brush, thereby lowering a service life of the encoder. Moreover, the electrical brush is riveted with the circuit plate at the high temperature, a height between the brush head of the electrical brush and a bottom surface of the movable arm decreases 50%, so the electrical brush contacts with the circuit plate unstably.

Also, an elastic arm of the electrical brush is too short (i.e., a distance between a riveting point or a fulcrum and the brush head of the electrical brush is too short), so as the height of the brush head changes, the length of the electrical brush is too short, then an angle between the elastic arm and the arm seat changes greatly to loosen the electric brush, hence the electrical brush contacts the circuit plate unstably.

The present invention has arisen to mitigate and/or obviate the afore-described disadvantages.

SUMMARY OF THE INVENTION

The primary object of the present invention is to provide an encoder which is capable of overcoming the shortcomings of the conventional encoder.

Another object of the present invention is to provide an encoder, a number of channels of which increases to 32 or more, so that the programming and operating control can be conveniently realized. The electric brush of the encoder is connected steadily with the circuit plate of the encoding circuit because of the electric brush without any loose situations.

To obtain the above objective, an encoder provided by the present invention contains:

a rotating shaft, an axis sleeve, a stopping base, a positioning elastic trip, a spacer, a partition plate, at least one movable arm, at least one electric brush, and at least one main body, wherein the at least one movable arm, the at least one electric brush, and the at least one main body match with each other;

the rotating shaft inserts through an axial hole of the axis sleeve;

the stopping base has an axial hole defined thereon so as to cooperate with an axial hole of the rotating shaft, the rotating shaft also inserts through the axial hole of the stopping base so that the stopping base rotates with the rotating shaft and is fixed in a recess of an upper surface of the rotating shaft;

a retaining ring is fitted onto the rotating shaft and retains with the axis sleeve, such that the rotating shaft and the axis sleeve are axially positioned;

the at least one movable arm has an axial hole defined thereon so as to insert the rotating shaft, such that the at least one movable arm rotates with the rotating shaft;

each main body has an axial hole formed thereon so as to insert the rotating shaft and includes a circuit plate mounted thereon, the circuit plate has an end portion extending outwardly from the main body so as to form a terminal for connecting with an external circuit, and the circuit plate has a surface for electrically contacting with a brush head of a respective one of the at least one electric brush so as to form a code signal which is outputted from the terminal; characterized in that the rotating shaft and the stopping base do not have any stopping structure, and a rotating angle of the rotating shaft is equal to or greater than 360 degrees;

each electric brush has a plastic covered part, a bent part, an elastic arm, and the brush head forming an integrated structure;

the plastic covered part is covered in a respective one of the at least one movable arm, the bent part connects the plastic covered part and the elastic arm and bends the elastic arm toward the plastic covered part, the elastic arm has a main arm with a long strip ring body and a branch arm, the brush head is pressed at two free ends of the main arm and the branch arm.

Preferably, the positioning elastic trip is annular and is in connection on an upper surface of the stopping base so as to rotate with the stopping base which is driven by the rotating shaft; the positioning elastic trip has at least one fixing notch arranged on at least one end of at least one diameter thereof.

Preferably, the spacer has an axial hole defined thereon so as to inset the rotating shaft and has a plurality of locating protrusions so as to correspond to the at least one fixing notch, the plurality of locating protrusions are evenly arranged around the axial hole of the spacer; the positioning elastic trip contacts with the spacer and its at least one fixing notch matches with the plurality of locating protrusions of the spacer so as to form a shift fixing structure, wherein a shift positioning unit corresponds to a code signal.

Preferably, the partition plate has an axial hole formed thereon so as to insert the rotating shaft and has an upper surface and a lower surface, both of which contact with a lower surface of the main body and an upper surface of the spacer.

Preferably, an aftermost main body has a back cover covered on an upper surface thereof, and the back cover is formed in a plate shape, a respective one of the back cover, the main body, the partition plate, the spacer, and the axis sleeve has at least one orifice defined thereon so as to insert at least one blot element, such that the back cover, the main body, the partition plate, the spacer, and the axis sleeve are connected together by the at least one bolt element.

Thereby, the advantages of the encoder of the present invention contain:

1. The rotating shaft and the stopping base do not have any stopping structure, and a rotating angle of the rotating shaft is equal to or greater than 360 degrees, hence a number of channels of which increases to 32 or more, so that the programming and operating control are conveniently realized.

2. The electric brush of the encoder is connected steadily with the circuit plate of the encoding circuit because of the electric brush without any loose situations, thus outputting signal stably so as to enhance the electrical performance.

3. Each electric brush has the plastic covered part, the bent part, the elastic arm, and the brush head, and the plastic covered part is covered in the at least one movable arm so as to lengthen the elastic arm, thus eliminating structural obstacle. Thereby, the bent part forms a fulcrum, a length of the elastic arm of the electric brush is increased (i.e., 50% more than an arm length of a rivet fixing structure). On one hand, due to the elastic arm of the electric brush is elongated, an opening angle of the elastic arm of the electric brush is decreased to limit an elastic change of the elastic arm, so the electric brush of the encoder is connected steadily with the circuit plate of the encoding circuit because of the electric brush without any loose situations. On the other hand, when a height of the brush head changes with a rotation of the rotating shaft, a change of the elastic arm reduces, thus increasing a contact stability of the electric brush and the circuit plate.

4. The encoder is widely used in audio, automotive, instrumentation and household appliances.

DETAILED DESCRIPTION OF THE PREFERRED EMBODIMENTS

Figure 1:
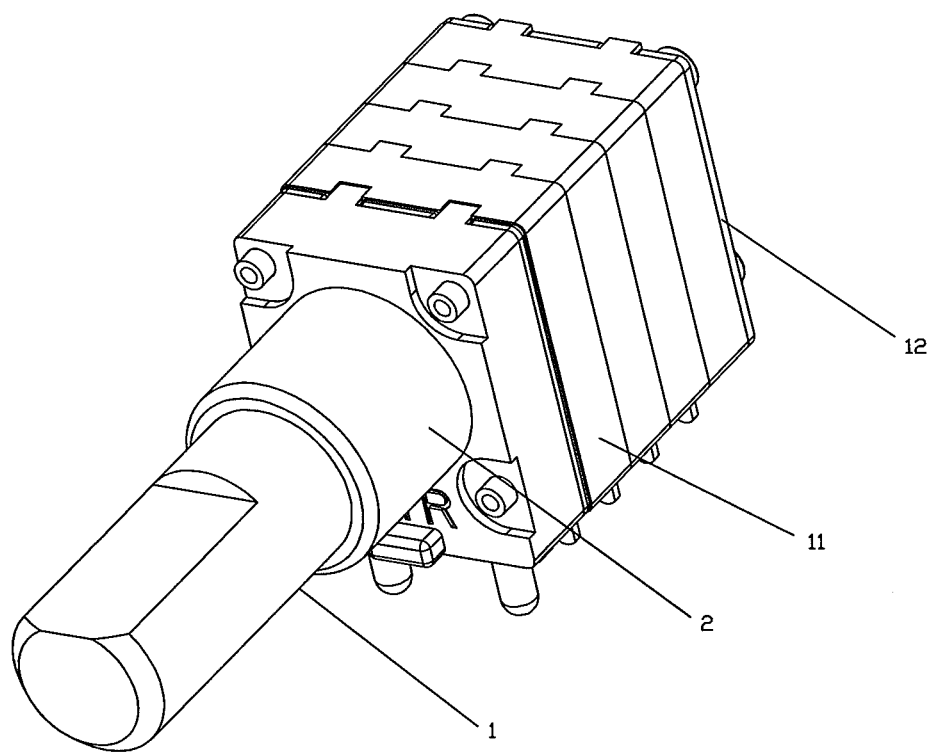
FIG. 1 is perspective view showing the assembly of an encoder with a stopping structure according to the present invention.
Figure 2:
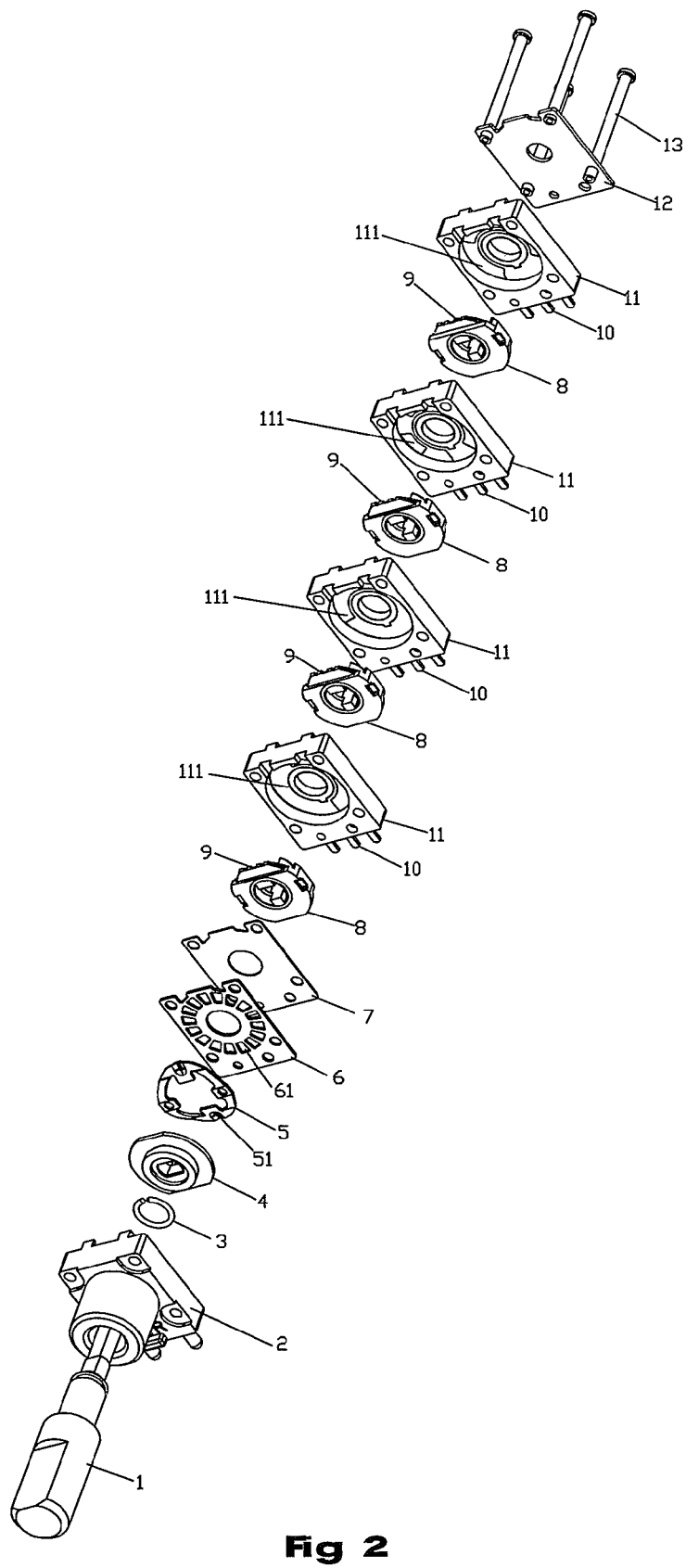
FIG. 2 is perspective view showing the exploded components of the encoder with the stopping structure according to the present invention.
Figure 3:
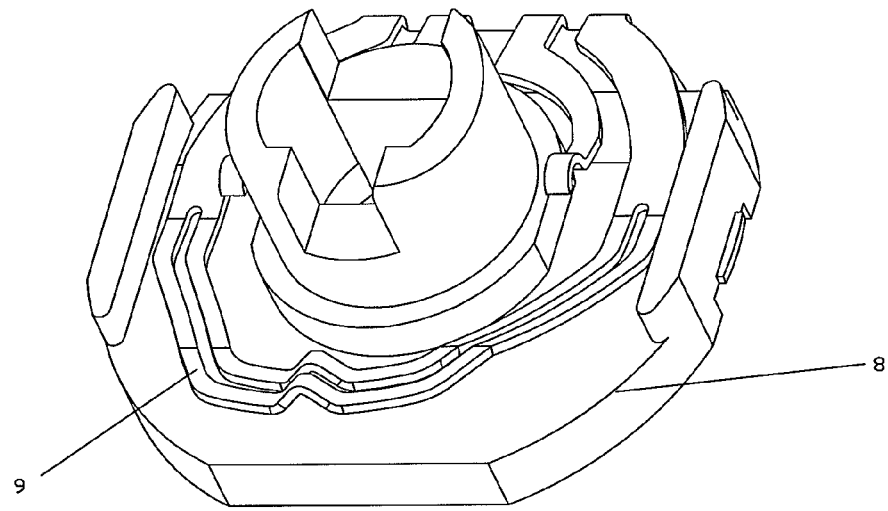
FIG. 3 is perspective view showing the assembly of an electric brush and a movable arm of the encoder with the stopping structure according to the present invention.
Figure 4:
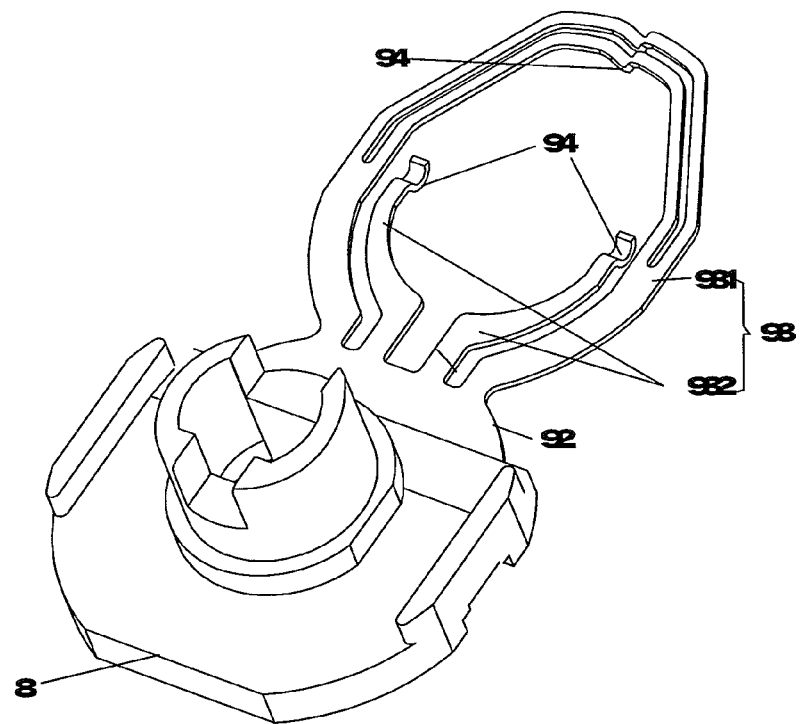
FIG. 4 is perspective view showing the exploded components of the electric brush and the movable arm of the encoder with the stopping structure according to the present invention.
Figure 5:
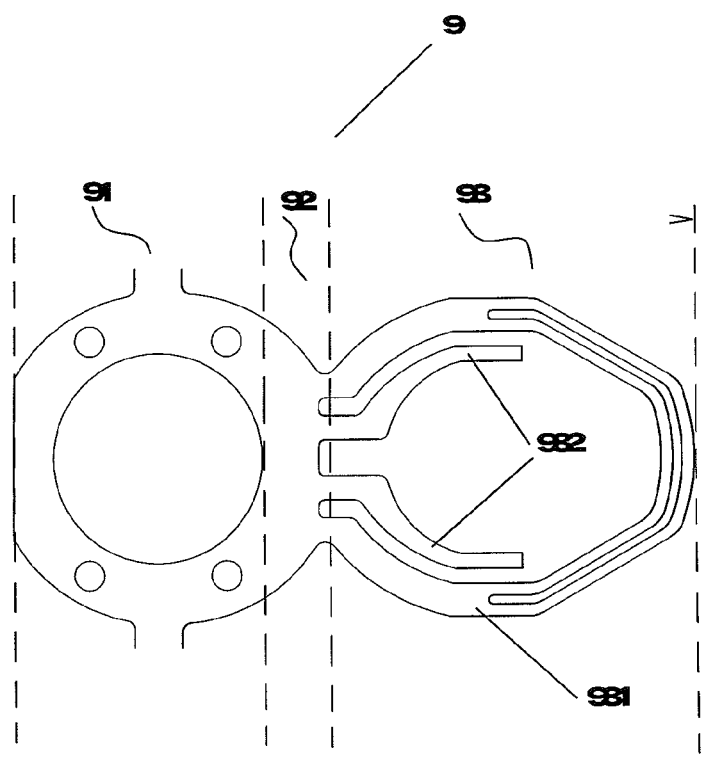
FIG. 5 is a top plan view of FIG. 4.

With reference to FIGS. 1-5, an encoder without a stopping structure according to the present invention comprises: a rotating shaft 1, an axis sleeve 2, a stopping base 4, a positioning elastic trip 5, a spacer 6, a partition plate 7, at least one movable arm 8, at least one electric brush 9, and at least one main body 11. The rotating shaft 1, the axis sleeve 2, the stopping base 4, the positioning elastic trip 5, the spacer 6, the partition plate 7, the at least one movable arm 8, the at least one electric brush 9, and the at least one main body 11 are sequentially arranged from bottom to top, wherein the at least one movable arm 8, the at least one electric brush 9, and the at least one main body 11 match with each other. As shown in FIGS. 1 and 2, there are four movable arms 8, four electric brushes 9, and four main bodies 11 arranged in the encoder. The rotating shaft 1 is a stepped shaft and inserts through an axial hole of the axis sleeve 2. The stopping base 4 has an axial hole defined thereon so as to cooperate with the axial hole of the rotating shaft 1. The rotating shaft 1 also inserts through the axial hole of the stopping base 4 so that the stopping base 4 rotates with the rotating shaft 1 and is fixed in a recess of an upper surface of the rotating shaft 1. A retaining ring 3 is fitted onto the rotating shaft 1 and retains with the axis sleeve 2, such that the rotating shaft 1 and the axis sleeve 2 are axially positioned. The at least one movable arm 8 has an axial hole defined thereon so as to insert the rotating shaft 1, such that the at least one movable arm 8 rotates with the rotating shaft 1. Each main body 11 has an axial hole formed thereon so as to insert the rotating shaft 1 and includes a circuit plate 111 mounted thereon. The circuit plate 111 has an end portion extending outwardly from the main body 11 so as to form a terminal 10 for connecting with an external circuit, and the circuit plate 111 has a surface for electrically contacting with a brush head 94 of a respective one of the at least one electric brush 9 so as to form a code signal which is outputted from the terminal. An improvement of the encoder of the present invention is described as follows.

The rotating shaft 1 and the stopping base 4 do not have any stopping structure, and a rotating angle of the rotating shaft 1 is equal to or greater than 360 degrees. Each electric brush 9 has a plastic covered part 91, a bent part 92, an elastic arm 93, and the brush head 94 forming an integrated structure. The plastic covered part 91 is covered in a respective one of the at least one movable arm 8. The bent part 92 connects the plastic covered part 91 and the elastic arm 93 and bends the elastic arm 93 toward the plastic covered part 91. The elastic arm 93 has a main arm 931 with a long strip ring body and a branch arm 932. The brush head 94 is pressed at two free ends of the main arm 931 and the branch arm 932.

The positioning elastic trip 5 is annular and is in connection on an upper surface of the stopping base 4 so as to rotate with the stopping base 4 which is driven by the rotating shaft 1. The positioning elastic trip 5 has at least one fixing notch 51 arranged on at least one end of at least one diameter thereof.

The spacer 6 has an axial hole defined thereon so as to inset the rotating shaft 1 and has a plurality of locating protrusions 61 so as to correspond to the at least one fixing notch 51. The plurality of locating protrusions 61 are evenly arranged around the axial hole of the spacer 6. The positioning elastic trip 5 contacts with the spacer 6 and its at least one fixing notch 51 matches with the plurality of locating protrusions 61 of the spacer 6 so as to form a shift fixing structure, wherein a shift positioning unit corresponds to a code signal.

The partition plate 7 has an axial hole formed thereon so as to insert the rotating shaft 1 and has an upper surface and a lower surface, both of which contact with a lower surface of the main body 11 and an upper surface of the spacer 6.

An aftermost main body 11 has a back cover 12 covered on an upper surface thereof, and the back cover 12 is formed in a plate shape. In addition, a respective one of the back cover 12, the main body 11, the partition plate 7, the spacer 6, and the axis sleeve 2 has at least one orifice defined thereon so as to insert at least one blot element 13, such that the back cover 12, the main body 11, the partition plate 7, the spacer 6, and the axis sleeve 2 are connected together by the at least one bolt element 13.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An encoder without a stopping structure comprising:
a rotating shaft (1), an axis sleeve (2), a stopping base (4), a positioning elastic trip (5), a spacer (6), a partition plate (7), at least one movable arm (8), at least one electric brush (9), and at least one main body (11), wherein the at least one movable arm (8), the at least one electric brush (9), and the at least one main body (11) match with each other;

the rotating shaft (1) inserts through an axial hole of the axis sleeve (2);

the stopping base (4) has an axial hole defined thereon so as to cooperate with an axial hole of the rotating shaft (1), the rotating shaft (1) also inserts through the axial hole of the stopping base (4) so that the stopping base (4) rotates with the rotating shaft (1) and is fixed in a recess of an upper surface of the rotating shaft (1);

a retaining ring (3) is fitted onto the rotating shaft (1) and retains with the axis sleeve (2), such that the rotating shaft (1) and the axis sleeve (2) are axially positioned;

the at least one movable arm (8) has an axial hole defined thereon so as to insert the rotating shaft (1), such that the at least one movable arm (8) rotates with the rotating shaft (1);

each main body (11) has an axial hole formed thereon so as to insert the rotating shaft (1) and includes a circuit plate (111) mounted thereon, the circuit plate (111) has an end portion extending outwardly from the main body (11) so as to form a terminal (10) for connecting with an external circuit, and the circuit plate (111) has a surface for electrically contacting with a brush head (94) of a respective one of the at least one electric brush (9) so as to form a code signal which is outputted from the terminal; characterized in that the rotating shaft (1) and the stopping base (4) do not have any stopping structure, and a rotating angle of the rotating shaft (1) is equal to or greater than 360 degrees;

each electric brush (9) has a plastic covered part (91), a bent part (92), an elastic arm (93), and the brush head (94) forming an integrated structure;

the plastic covered part (91) is covered in a respective one of the at least one movable arm (8), the bent part (92) connects the plastic covered part (91) and the elastic arm (93) and bends the elastic arm (93) toward the plastic covered part (91), the elastic arm (93) has a main arm (931) with a long strip ring body and a branch arm (932), the brush head (94) is pressed at two free ends of the main arm (931) and the branch arm (932).

2. The encoder without the stopping structure as claimed in claim 1, characterized in that the positioning elastic trip (5) is annular and is in connection on an upper surface of the stopping base (4) so as to rotate with the stopping base (4) which is driven by the rotating shaft (1); the positioning elastic trip (5) has at least one fixing notch (51) arranged on at least one end of at least one diameter thereof.

3. The encoder without the stopping structure as claimed in claim 1, characterized in that the spacer (6) has an axial hole defined thereon so as to inset the rotating shaft (1) and has a plurality of locating protrusions (61) so as to correspond to the at least one fixing notch (51), the plurality of locating protrusions (61) are evenly arranged around the axial hole of the spacer (6); the positioning elastic trip (5) contacts with the spacer (6) and its at least one fixing notch (51) matches with the plurality of locating protrusions (61) of the spacer (6) so as to form a shift fixing structure, wherein a shift positioning unit corresponds to a code signal.

4. The encoder without the stopping structure as claimed in claim 1, characterized in that the partition plate (7) has an axial hole formed thereon so as to insert the rotating shaft (1) and has an upper surface and a lower surface, both of which contact with a lower surface of the main body (11) and an upper surface of the spacer (6).

5. The encoder without the stopping structure as claimed in claim 1, characterized in that an aftermost main body (11) has a back cover (12) covered on an upper surface thereof, and the back cover (12) is formed in a plate shape, a respective one of the back cover (12), the main body (11), the partition plate (7), the spacer (6), and the axis sleeve (2) has at least one orifice defined thereon so as to insert at least one blot element (13), such that the back cover (12), the main body (11), the partition plate (7), the spacer (6), and the axis sleeve (2) are connected together by the at least one bolt element (13).

\* \* \* \* \*